United States Patent [19]
Onomura et al.

[11] Patent Number: 6,067,309
[45] Date of Patent: May 23, 2000

[54] COMPOUND SEMICONDUCTOR LIGHT-EMITTING DEVICE OF GALLIUM NITRIDE SERIES

[75] Inventors: Masaaki Onomura, Kawasaki; Kazuhiko Itaya; Genichi Hatakoshi, both of Yokohama, all of Japan

[73] Assignee: Kabushiki Kaisha Toshiba, Kawasaki, Japan

[21] Appl. No.: 08/921,693

[22] Filed: Sep. 2, 1997

[30] Foreign Application Priority Data

Sep. 6, 1996 [JP] Japan .................................. 8-236743

[51] Int. Cl.[7] .................................................. H01S 3/19
[52] U.S. Cl. .................................................. 372/46; 372/45
[58] Field of Search .................................. 372/46, 45

[56] References Cited

U.S. PATENT DOCUMENTS

| | | | |
|---|---|---|---|
| 5,740,192 | 4/1998 | Hatano et al. | 372/45 |
| 5,821,555 | 10/1998 | Saito et al. | 372/45 |

FOREIGN PATENT DOCUMENTS

| | | |
|---|---|---|
| 3-286526 | 12/1991 | Japan . |
| 5-291621 | 11/1993 | Japan . |

*Primary Examiner*—James W. Davie
*Attorney, Agent, or Firm*—Oblon, Spivak, McClelland, Maier & Neustadt, P.C.

[57] ABSTRACT

There is disclosed a compound semiconductor light-emitting device of gallium nitride series having high reliability, which can be operated by a low threshold current and a low operation voltage without deterioration. The device comprises a p-type semiconductor structure having high carrier concentration, which can easily form a low resistance p-side electrode, and which can uniformly implant carriers to an active layer highly efficiently. A p electrode contact layer having Mg added thereto is used as a p-type semiconductor layer. At least a $Ga_{x2}In_{y2}Al_{z2}N$ (x2+y2+z2=1, $0 \leq x2$, $z2 \leq 1$, $0<y2 \leq 1$) smoothing layer is formed on an active layer than the p-type contact layer. On a surface of the p-type contact layer, there is formed a layered structure having a Pt layer, and a Ti layer containing TiN, and a Ti layer in order. An alloy, formed of Pt-semiconductor, is formed between the p-type contact layer and the Pt layer.

28 Claims, 10 Drawing Sheets

COMPOUND SEMICONDUCTOR LIGHT-EMITTING DEVICE OF GALLIUM NITRIDE SERIES

BACKGROUND OF THE INVENTION

The present invention relates to a compound semiconductor light-emitting device of gallium nitride series such as purple blue semiconductor laser of gallium nitride series (hereinafter called LD) or blue/green light-emitting diode of gallium nitride series having high luminance (hereinafter called LED).

A conventional shortwave semiconductor laser is improved to an extent that reading/writing of a disk can be executed by a light source of 600 nm zone using InGaAlP and is already put to practical use.

In order to further improve recording density, shortwave blue semiconductor laser has been developed. A laser beam whose oscillation wave is short is useful to reduce a convergent size and to improve recording density.

For this reason, the compound semiconductor device of gallium nitrite series such as GaN, InGaN, GaAlN, InGaAlN has been recently considered as a material of the shortwave semiconductor laser to improve the application to a high density optical disk system.

For example, in the semiconductor laser using GaN series material, a room temperature pulse oscillation having wavelength of 380 to 417 nm is confirmed. However, in the semiconductor laser using GaN series material, a satisfying characteristic cannot be obtained, a threshold voltage for a room temperature pulse oscillation ranges from 10 to 40V, and the variation of the value is large.

This variation is caused by difficulty in a crystal growth of the compound semiconductor layer of gallium nitride series, and large device resistance. More specifically, there cannot be formed the compound semiconductor layer of p-type gallium nitride series having a smooth surface and high carrier concentration. Moreover, since contact resistance of a p-side electrode is high, a large voltage drop is generated, so that the semiconductor layer is deteriorated by a heat generation and a metal reaction even when the pulse oscillation is operated. In consideration of a cheating value, the room temperature continuous oscillation cannot be achieved unless the threshold voltage is reduced to less than 10V.

Moreover, when a current necessary to the laser generation is implanted, the high current flows locally and a carrier cannot be uniformly implanted to an active layer, and an instantaneous breakage of the device occurs. As a result, the continuous generation of the laser cannot be achieved.

Thus, to realize the purple blue semiconductor laser of gallium nitride series having high reliability, which is operated by the low threshold current to be used in the optical disk and the low threshold voltage, the following points are important:

Specifically, the efficient and uniform implantation of the carriers to the active layer and the reduction of the voltage drop by the electrode contact are important.

However, it is difficult to extremely execute such points in the present state.

As mentioned above, in the compound semiconductor laser of gallium nitride series, it is difficult to obtain the compound semiconductor laser having a good p-type gallium nitride series with no fine porous defects. Moreover, since the p-side electrode contact resistance is high, large voltage drop is generated by the electrode contact. Further, since the carriers cannot be uniformly implanted to the active layer, it is difficult to realize the device with the low threshold current and the low operating voltage.

In the light-emitting device of GaN series, since the p-side electrode contract resistance was high, the operating voltage was increased. Moreover, nickel, serving as a p-side electrode metal, and gallium forming the p-type semiconductor layer, were reacted with each other, melted, and deteriorated at an electrical conduction. As a result, it was difficult to continuously generate the laser.

BRIEF SUMMARY OF THE INVENTION

An object of the present invention is to provide a compound semiconductor light-emitting device of gallium nitrite series having high reliability, which can be operated by a low threshold current and a low operating voltage without deterioration, by use of a compound semiconductor structure of a p-type nitride gallium series with a high carrier concentration which can easily form a low resistance p-side electrode and which can implant carriers to an active layer uniformly and efficiently.

To attain the above object, there is provided a compound semiconductor light-emitting device of gallium nitride series having a compound semiconductor of gallium nitride series ($Ga_{x1}In_{y1}Al_{z1}N$: $x1+y1+z1=1$, $0 \leq x1$, $y1$, $z1 \leq 1$), the compound semiconductor light-emitting device comprising:

a substrate;

a semiconductor layer formed on the substrate;

an n-type semiconductor layer, formed on the semiconductor layer, having at least an n-type clad layer;

an active layer formed on the n-type semiconductor layer;

a p-type semiconductor layer, formed on the active layer, having at least a p-type clad layer;

a smoothing layer of $Ga_{x2}In_{y2}Al_{z2}N$ ($x2+y2+z2=1$, $0 \leq x2$, $z2 \leq 1$, $0 < y2 \leq 1$) formed on the p-type semiconductor layer or the active layer;

a p-type contact layer, formed on the p-type semiconductor layer, having Mg added thereto;

a p-side electrode formed on the p-type contact layer; and an n-side electrode formed on either the n-type semiconductor layer or a substrate.

Thus, the p-type semiconductor layer of gallium nitride series having Mg added is formed on the GaInAlN smoothing layer containing at least In element, the number of crystal defects such as porous micro detects is small, and acceptor concentration of p-type semiconductor layer can be increased.

The active layer may be a multi-quantum well structure having well layers formed of at least $Ga_{x3}In_{y3}Al_{z3}N$ ($x3+y3+z3=1$, $0 \leq x3$, $y3$, $z3 \leq 1$), and barrier layers, formed $Ga_{x4}In_{y4}Al_{z4}N$ ($x4+y4+z4=1$, $0 \leq x4$, $y4$, $z4 \leq 1$), alternatively layered.

As this time, the $Ga_{x2}In_{y2}Al_{z2}N$ smoothing layer is formed to be thicker than the thickness of the well layer when In composition y2 is lower than In composition y3 of the well layer. Thereby, the effective refractive index of the active layer 6 is increased, so that a light guiding characteristic can be improved. In the $Ga_{x2}In_{y2}Al_{z2}N$ smoothing layer, p-type carrier concentration may be $1 \times 10^{18}$ cm$^{-3}$ or more. Thereby, the overflow of the electrons can be prevented, and the laser can be generated by the low threshold value.

On the other hand, the $Ga_{x2}In_{y2}Al_{z2}N$ smoothing layer is formed to be thinner than the thickness of the well layer when In composition y2 is higher than In composition y3 of the well layer. Thereby, the smoothing layer functions as a saturated absorption layer, so that the noise of the laser can be reduced.

Also, the p-type contact layer may have an alloy layer, made of Pt-semiconductor, selectively formed on its surface. The p-side electrode has a layered structure made of a Pt layer formed on the alloy layer, a Ti layer containing TiN, thereon, and a Ti layer thereon. The Au layer may be formed on the Ti layer through the second Pt layer.

Thereby, the thin Pt layer, serving as an electrode metal, is slightly diffused to the p-type semiconductor layer, so that the effective electrode contact area is increased. Also, the Pt element works as reduction catalysts of the hydrogen element, which is introduced at the same time with the addition of Mg, and a surface oxide film due to air exposure after the crystal growth. As a result, the activation ratio of Mg can be improved, and effective acceptor concentration can be improved. Moreover, the Ti layer of the upper portion reacts with the nitride element of the semiconductor layer of gallium nitride series, so that extremely stable TiN is formed. As a result, the second Pt layer, serving as an electrode metal of the upper portion, and the Au layer can be restrained from being diffused downward, and the quality of the crystal can be improved.

Furthermore, when the p-type contact layer contains carbon, carbon concentration of the boundary between the Ti layer containing Ti and the Pt layer is higher than carbon concentration of the p-type contact layer.

When the p-type contact layer contains oxygen, oxygen concentration of the boundary between the Ti layer containing Ti and the Pt layer is higher than oxygen concentration of the p-type contact layer. An alloy layer made of Pt and p-type contact layer has MgO which is strong bound to Mg added in p-type contact layer.

In other words, carbon and oxygen of the semiconductor layer are stopped by the Ti layer containing TiN during the process in which they are moved outside of the p-type contact layer by Pt as a catalyst. As a result, the same function as mentioned above can be brought about. Also, effective electrode contact resistance is more reduced by MgO having low contact resistance for p-type contact layer.

When the p-type contact layer contains hydrogen, hydrogen concentration of the boundary between the second Pt layer and the Au layer is higher than hydrogen concentration of the p-type contact layer.

In other words, hydrogen of the semiconductor layer is moved outside of the p-type contact layer by Pt as a catalyst. As a result, the same function as mentioned above can be brought about.

The n-side electrode may have the layered structure having the Ti layer and the Au layer formed in order. When the substrate is an insulating material, the n-side electrode is formed on the n-type semiconductor layer which is exposed to the surface of the substrate. When the substrate is a conductive substrate such as SiC, the n-side electrode is formed on the rear face of the substrate.

Moreover, in the case of an inner stripe structure, according to the present invention, there is provided a compound semiconductor light-emitting device of gallium nitride series having a compound semiconductor of gallium nitride series $(Ga_{x1}In_{y1}Al_{z1}N: x1+y1+z1=1, 0 \leq x1, y1, z1 \leq 1)$, the compound semiconductor light-emitting device comprising:

a substrate;

a semiconductor layer formed on the substrate;

an n-type clad layer formed on the semiconductor layer;

an n-type waveguide layer formed on the n-type clad layer;

an active layer formed on the n-type waveguide layer;

a p-type waveguide layer, formed on the active layer, having a stripe ridge;

a block layer selectively formed on along a side portion of the ridge of the p-type waveguide layer;

a smoothing layer of $Ga_{x2}In_{y2}Al_{z2}N$ $(x2+y2+z2=1, 0 \leq x2, z2 \leq 1, 0<y2 \leq 1)$ formed on the block layer and the ridge of the p-type conductive layer;

a p-type clad layer formed on the $Ga_{x2}In_{y2}Al_{z2}N$ smoothing layer;

a p-type contact layer, formed on the p-type clad layer, having Mg added thereto;

a p-side electrode formed on the p-type contact layer; and an n-side electrode formed on either the n-type semiconductor layer or a substrate.

In this case, the block layer may be formed of $Ga_{x5}In_{y5}Al_{z5}N$ $(x5+y5+z5=1, 0 \leq x5, y5 \leq 1, 0<z5 \leq 1)$. This is suitable for the restraint of a crack. Also, the block layer may be formed of $Ga_{x5}In_{y5}Al_{z5}N$ $(x5+y5+z5=1, 0 \leq x5, z5 \leq 1, 0<y5 \leq 1)$. This is suitable for the control of a transverse mode. The conditions of the active layer, the electrode structure, and the smoothing layer are explained above.

In addition, favorable specific forms of the above-explained present invention can be obtained by satisfying the following conditions as many as possible:

(1) The amount of Mg added to the p-type electrode contact layer has a high concentration distribution in the vicinity of the surface.

(2) The p-type electrode contact layer is formed of compound semiconductors of two or more kinds of gallium nitride series whose compositions are different from each other.

(3) The GaInAlN smoothing layer is formed such that the active layer is a multi-quantum well structure.

(4) When the n-type conductive layer exists on the lower portion of the p-type electrode contact layer, at least one GaInAlN smoothing layer is inserted between the p-type conductive layer and the n-type conductive layer. In other words, it is important to form the electrode contact layer on the upper layer than the GaInAlN smoothing layer. It does not matter whether or not the clad layer and the waveguide layer are formed between the GaInAlN smoothing layer and the p-type electrode contact layer.

(5) The electrode structure contacting the p-type electrode contact layer is formed such that Ti/Pt/Au are layered on the upper portion of the thin Pt layer whose film thickness is 10 nm or less.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Embodiments of the present invention will now be described with reference to the accompanying drawings.

(First embodiment)

Figure 1:
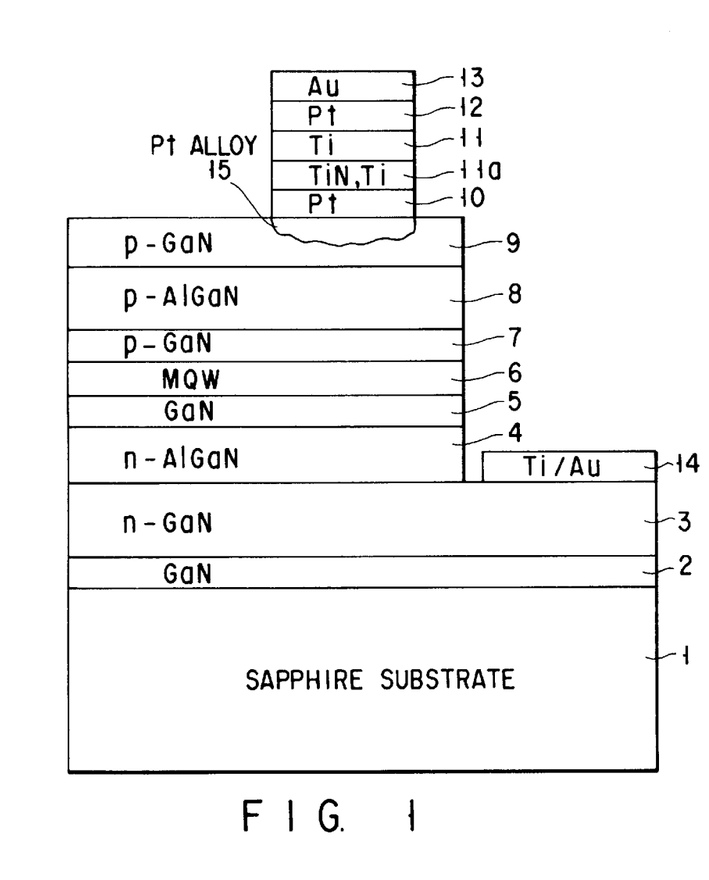
FIG. 1 is a cross-sectional view showing the schematic structure of a blue semiconductor laser according to a first embodiment of the present invention.

FIG. 1 is a cross-sectional view showing the schematic structure of a blue semiconductor laser according to a first embodiment of the present invention. The blue semiconductor laser has a multi-layered structure having a GaN buffer layer 2, an n-type GaN contact layer (Si dope, $5 \times 10^{18}$ cm$^{-3}$, 4 $\mu$m) 3, an n-type $Al_{0.2}Ga_{0.8}N$ clad layer (Si dope, $5 \times 10^{17}$ cm$^{-3}$, 0.3 $\mu$m) 4, a GaN waveguide layer (undope, 0.1 $\mu$m) 5, an active layer 6, a p-type GaN waveguide layer (Mg dope, 0.3 $\mu$m) 7, a p-type $Al_{0.2}Ga_{0.8}N$ clad layer (Mg dope, $5 \times 10^{17}$ cm$^{-3}$, 0.3 $\mu$m) 8, and a p-type GaN contact layer (Mg dope, $1 \times 10^{18}$ cm$^{-3}$, 1 $\mu$m) 9 sequentially formed on a sapphire substrate 1 by MOCVD.

On the p-type GaN contact layer 9, there are sequentially layered a Pt layer 10 having a thickness of 10 nm, a Ti layer 11a containing TiN treated by heat (to be described later), a Ti layer 11 having a thickness of 30 nm, a Pt layer 12 having a thickness of 10 nm, and an Au electrode pad 13 having a thickness of 1 $\mu$m, thereby forming a p-type electrode.

A part of the uppermost surface of the Au electrode pad 13 and the p-type GaN contact layer 9 are removed up to a portion reaching the n-type GaN contact layer 3 by dry-etching. Thereby, on the exposed n-type GaN contact layer 3, an n-side electrode 14 is formed.

The active layer 6 is formed of $In_{0.2}Ga_{0.8}N$ multi-quantum wells (undope, 2.5 nm) and an $In_{0.05}Ga_{0.95}N$ barrier wall layers (undope, 5 nm), which are alternatively layered on each other to make 10 layers in all. Also, the impurity in p-type GaN waveguide layer, p-type AlGaN clad layer and p-type GaN layer, are not limited to Mg, but may be any p-type impurity, like Zn.

Next, the following will explain the manufacturing method of the blue semiconductor laser and its function.

In FIG. 1, each of GaN buffer layer 2 to p-type GaN contact layer 9 on the sapphire substrate 1 is formed by one MOCVD.

In the blue semiconductor laser, a GaInAlN smoothing layer containing In is used as InGaN quantum well active layer 6, and semiconductors 7 and 9 of a nitride gallium series to which Mg is added are formed thereon. Due to this, the GaInAlN smoothing layer restrains the fine porous defects propagated from the substrate 1 and crystal defects such as a crack and a transition. As a result, smooth p-type semiconductor layers can be obtained on the p-side electrode side.

According to the experiment made by the inventors of the present invention, even if the GaInAlN smoothing layer is not formed, the plurality of porous detects can be buried in the surface of the p-type GaN contact layer 9 when the thickness of the p-type GaN contact layer 9 is 0.6 $\mu$m and more. In other words, in addition to the formation of the GaInAlN smoothing layer, the thickness of the p-type GaN contact layer 9 is set to 0.6 $\mu$m or more. Thereby, the quality of the p-type semiconductor layer can be surely improved.

Next, Pt (5 nm)/Ti (30 nm)/Pt (10 nm)/Au (1 $\mu$m) layers are sequentially layered on a 10-width $\mu$m area of the surface of the p-type GaN contact layer 9.

Then, when thermal treatment is provided to the entire substrate under a nitrogenous atmosphere at 350° C., Pt is diffused down to a depth, which is three times deeper than the thickness of the layered film at its maximum. Then, Pt is solid phase reacted with Ga of p-type GaN contact layer 9, so that an alloy layer 15 of Pt-semiconductor is formed. At the same time, Ti is solid phase reacted with N diffusing upward from the p-type GaN contact layer 9. As a result, Ti and N are stably combined with each other, the Ti layer 11a containing TiN is formed at a boundary surface between the Ti layer and the Pt layer. By this heat treatment, Pt works as a catalyst, and hydrogen and carbon elements, which prevent the activation of Mg (p-type dopant) as an acceptor, or an oxygen element, which is combined with the surface of the contact layer 9 by air exposure before forming the electrode, are removed from the film. As a result, acceptor concentration is increased, and an activation ratio of Mg becomes substantially 100% (the hydrogen, carbon, and oxygen elements are distributed in the multi-layered structure having the respective semiconductor layers at substantially fixed concentration before the above thermal treatment by various reasons at a growth time).

Moreover, on the boundary surface between the Ti layer 11a containing TiN and the Pt layer 10, concentration of each of carbon and oxygen elements is higher than that in the p-type GaN contact layer 9. In other words, in the process in which the carbon and oxygen of the semiconductor layer are removed outside by the catalyst of Pt, they are stopped by the Ti layer 11a containing TiN.

Furthermore, on the boundary surface between the Pt layer 12 and the Au layer 13, hydrogen concentration is higher than that in the p-type GaN contact layer 9. In other words, in the process in which the carbon and oxygen of the semiconductor layer are removed outside by the catalyst of Pt, they are stopped by the Au layer 13.

Next, a mesa shape containing a p-side electrode is formed to form the n-side electrode 14. The n-side electrode 14, which is made of Ti/Au, is formed on the n-type GaN contact layer 3 appearing at a lower portion of the mesa form. In this case, the p-side electrode may be formed after forming the n-side electrode 14. Moreover, the sapphire substrate 1 is mirror polished up to 50 $\mu$m, and cleaved in a vertical direction against the longitudinal direction of the p-side electrode. Thereby, a laser chip having a length of 1 mm is formed.

The above-explained blue semiconductor laser was continuously generated at room temperature at the threshold current of 80 mA. In this case, the wavelength was 420 nm, the operation voltage was 7V, and a device life time was 5000 hours under conditions of 50° C. and 30 mW drive. In the case of this laser, the substantial contact area between the Pt layer 10 and the p-type GaN contact layer 9 was increased. Due to this, resistance was reduced to $1\times10^{-5}$ $\Omega\text{cm}^2$. Also, an Mg activation ratio of the p-type GaN contact layer 9 was improved to substantially 100%. As a result, high carrier concentration was obtained, and the carriers were uniformly implanted to the active layer 6 through the P-type AlGaN clad layer 8.

Moreover, in the blue semiconductor laser in which two-step dope is provided, the characteristic was further improved. In this case, the two-step dope means that the amount of addition of Mg to the P-type GaN contact layer of the above-explained first embodiment is doubled in the range from the surface to 0.2 $\mu$m and is set to ½ in the residual range of 0.8 $\mu$m. More specifically, in this structured semiconductor laser, the operation voltage was further reduced to 6.5V as compared with the first embodiment. By forming the p-type contact layer in the two-step dope manner, there were obtained an advantage in which electrode contact resistance on the surface was reduced and an advantage in which resistance of the lower portion of the contact layer was increased to control the leak current to the horizontal direction.

According to the above-mentioned first embodiment, the semiconductor layer of nitride gallium series to which Mg is added is formed on the GaInAlN smoothing layer containing at least In, thereby reducing crystal defects such as porous micro detects.

Also, the Pt layer 10 is formed on the p-type GaN contact layer 9, and the Pt layer is slightly diffused to the p-type GaN contact layer 9. Thereby, the effective electrode contact area is increased. The Pt element works as reduction catalysts of the hydrogen element, the carbon element, and the oxygen element, which exist in the p-type semiconductor layer by various reasons. Then, these impurity elements are removed from the p-type semiconductor layer. As a result, the activation ratio of Mg can be improved, and effective acceptor concentration can be increased.

Moreover, the Ti layer 11 is formed on the Pt layer 10, and the Ti layer reacts with the N element of the semiconductor layer of nitride gallium series, so that the extremely stable TiN is formed. As a result, the second Pt layer 12, serving as an upper electrode metal and the Au layer 13 can be prevented from being diffused downward.

By the respective advantages of these GaInAlN smoothing layer, Pt layer 10, and Ti layer 11, the quality of the crystal can be improved.

Therefore, there can be realized a compound semiconductor structure of p-type gallium nitrite series with a high carrier concentration, which can easily form a low resistance p-side electrode, and which can implant carriers to an active layer uniformly and efficiently. Then, the voltage drop generated by the electrode contract can be restrained, and no deterioration occurs under conditions of a low threshold current and a low operation voltage without deterioration, so that excellent reliability can be brought about.

(Second embodiment)

Figure 2:
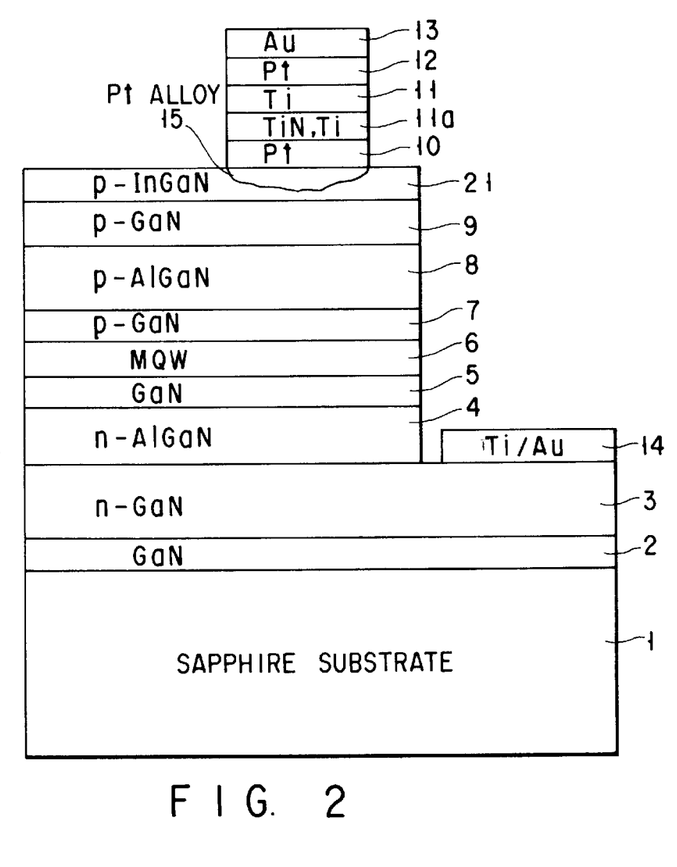
FIG. 2 is a cross-sectional view showing the schematic structure of a blue semiconductor laser according to a second embodiment of the present invention.

Next, the blue semiconductor laser of the second embodiment will be explained. FIG. 2 is a cross sectional view showing the schematic structure of the blue semiconductor laser. In FIG. 2, the same reference numerals as FIG. 1 are added to the portions common to FIG. 1, and the specific explanation will be omitted. Then, only the portions different from FIG. 1 will be described.

The semiconductor laser of this embodiment is to further improve contact resistance as compared with the first embodiment. More specifically, FIG. 2 shows the structure in which a p-type $In_{0.1}Ga_{0.9}N$ contact layer 21 is inserted between the p-type GaN layer 9 and the Pt electrode 10.

The p-type $In_{0.1}Ga_{0.9}N$ contact layer 21 is a semiconductor layer (Mg dope, $1\times10^{19}$ cm$^{-3}$, 0.2 $\mu$m).

Excepting for the formation of the p-type $In_{0.1}Ga_{0.9}N$ contact layer 21, this blue semiconductor laser is manufactured by the same way as the first embodiment.

The above-explained blue semiconductor laser was continuously generated at room temperature at the threshold current of 75 mA. In this case, the wavelength was 420 nm, the operation voltage was 6V, and a device life time was 5000 hours under conditions of 50° C. and 30 mW drive. According to this laser, in the contact layer 21 contacting Pt layer 10, since a bandgap is narrower than the p-type GaN layer 9, a Schottky barrier was reduced. Therefore, electrode contact resistance was reduced to $7\times10^{-6}$ $\Omega\text{cm}^2$ together with the substantial contact area increasing effect. In addition, the Mg activation ratio of the contact layer 21 was improved to substantially 100%. As a result, high carrier concentration was obtained, and the carriers were uniformly implanted to the active layer 6 through the p-type AlGaN clad layer 8.

Thus, according to the second embodiment, the contact layer 21 whose bandgap is narrower than the p-type GaN layer 9 is inserted between the p-type GaN layer 9 and the Pt electrode 10. As a result, in addition to the advantage explained in the first embodiment, contact resistance with the p-side electrode can be further reduced, so that the reduction of the operation voltage can be improved.

(Third embodiment)

Figure 3:
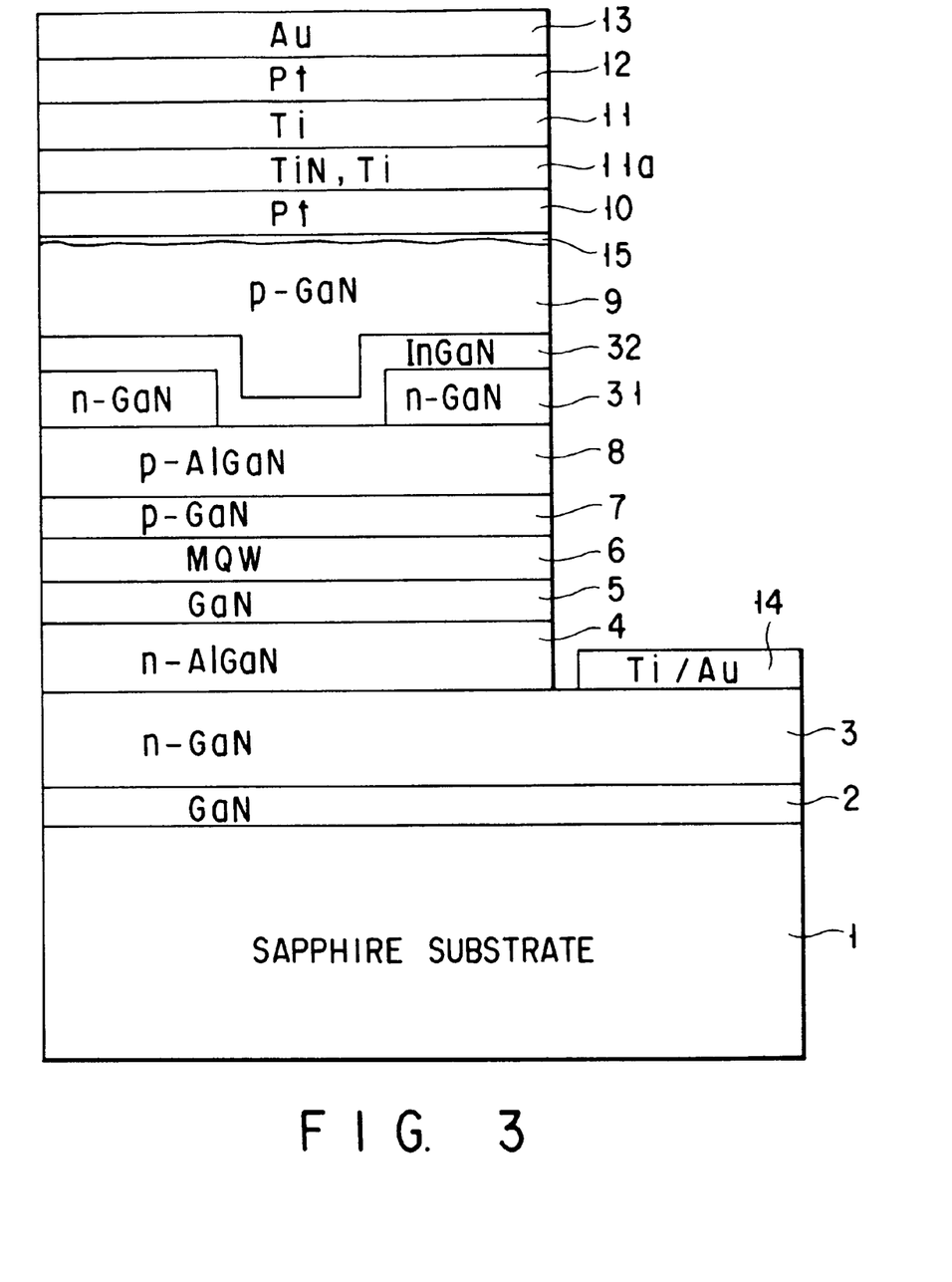
FIG. 3 is a cross-sectional view showing the schematic structure of a blue semiconductor laser according to a third embodiment of the present invention.

Next, the blue semiconductor laser of the third embodiment will be explained. FIG. 3 is a cross sectional view showing the schematic structure of the blue semiconductor laser. In FIG. 3, the same reference numerals as FIG. 1 are added to the portions common to FIG. 1, and the specific explanation will be omitted. Then, only the portions different from FIG. 1 will be described.

Unlike the first embodiment, the semiconductor laser of this embodiment has an inner stripe structure. Specifically, as shown in FIG. 3, in the inner stripe structure, there are formed a plurality of n-type GaN current block layers 31 ($1\times10^{18}$ cm$^{-3}$, 0.5 $\mu$m), which are selectively formed on p-type $Al_{0.2}Ga_{0.8}N$ clad layer 8, and an $In_{0.1}Ga_{0.9}N$ smoothing layer 32 with a thickness of 0.1 $\mu$m, which is formed on the clad layer 8 and each current block layer 31.

Similarly, On the $In_{0.1}Ga_{0.9}N$ smoothing layer 32, the p-type GaN contact layer 9 is formed.

This blue semiconductor laser is manufactured by the same way as the first embodiment, except that the number of times of growths by MOCVD is three due to the inner stripe structure.

The above-explained blue semiconductor laser was continuously generated at room temperature at the threshold current of 70 mA. In this case, the wavelength was 420 nm, the operation voltage was 6.5V, and a device life time was 5000 hours under conditions of 50° C. and 30 mW drive. According to this laser, in addition to the advantage explained in the first embodiment, since the inner stripe structure was formed, the area of the p-side electrode was increased, and p-side electrode contact resistance was reduced to $5 \times 10^{-6}$ $\Omega cm^2$. In other words, the low voltage operation was further improved by the inner stripe structure.

Thus, according to the third embodiment, contact resistance can be further reduced in addition to the advantage explained in the first embodiment.

Even if the p-type GaN contact layer 9 is formed just on the $In_{0.1}Ga_{0.9}N$ smoothing layer 32, the smoothing layer 32 prevents the propagation of porous micro detects. Therefore, the quality of the crystal can be improved.

(Fourth embodiment)

Figure 4:
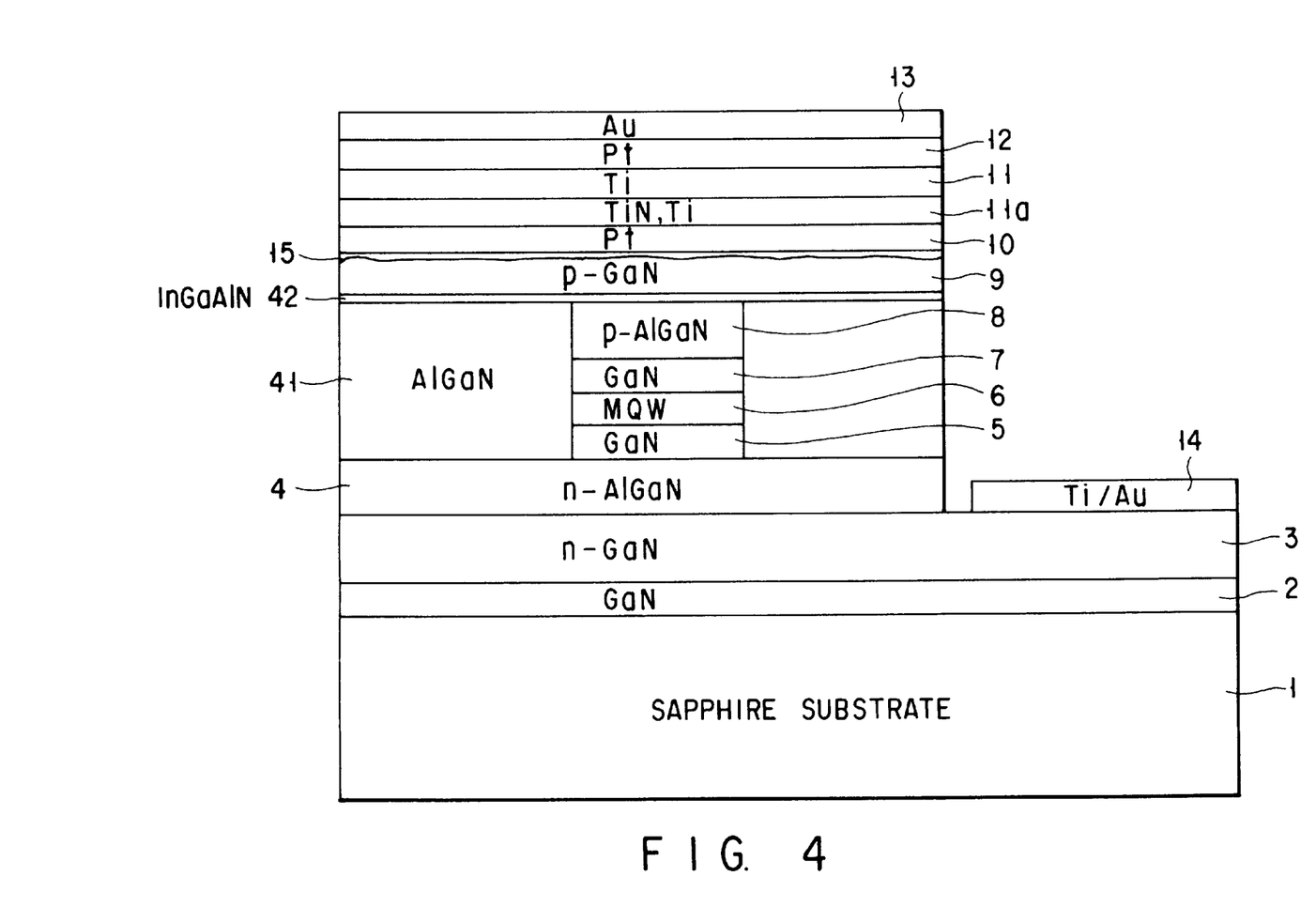
FIG. 4 is a cross-sectional view showing the schematic structure of a blue semiconductor laser according to a fourth embodiment of the present invention.

Next, the blue semiconductor laser of the fourth embodiment will be explained. FIG. 4 is a cross sectional view showing the schematic structure of the blue semiconductor laser. In FIG. 4, the same reference numerals as FIG. 1 are added to the portions common to FIG. 1, and the specific explanation will be omitted. Then, only the portions different from FIG. 1 will be described.

Unlike the first embodiment, the semiconductor laser of this embodiment has a buried inner stripe structure. Specifically, as shown in FIG. 4, the GaN waveguide layer 5 to the p-type $Al_{0.2}Ga_{0.8}N$ clad layer 8 are formed to have the mesa structure having a width of 10 μm. Then, an undope $Al_{0.1}Ga_{0.9}N$ block layer 41 is formed on both ends of the mesa structure. Moreover, an InGaAlN smoothing layer 42 is formed among the $Al_{0.1}Ga_{0.9}N$ block layer 41, the p-type $Al_{0.2}Ga_{0.8}N$ clad layer 8, and the p-type GaN contact layer 9.

This blue semiconductor laser is manufactured by the same way as the first embodiment, except that the number of times of growths by MOCVD is three due to the buried inner stripe structure.

The above-explained blue semiconductor laser was continuously generated at room temperature at the threshold current of 60 mA. In this case, the wavelength was 420 nm, the operation voltage was 5V, and a device life time was 5000 hours under conditions of 50° C. and 30 mW drive. According to this laser, in addition to the advantage explained in the first embodiment, since the buried inner stripe structure was formed, the areas of the p-side electrodes were increased, and p-side electrode contact resistance was reduced to $5 \times 10^{-6}$ $\Omega cm^2$. In other words, by the reduction of the gain level of oscillation threshold due to the thin film quantum well active layer whose thickness is less than a critical film thickness and the buried inner stripe structure, the low voltage operation was further improved.

Thus, according to the fourth embodiment, the inner stripe structure can be formed in addition to the advantage explained in the first embodiment.

(Fifth embodiment)

Figure 5:
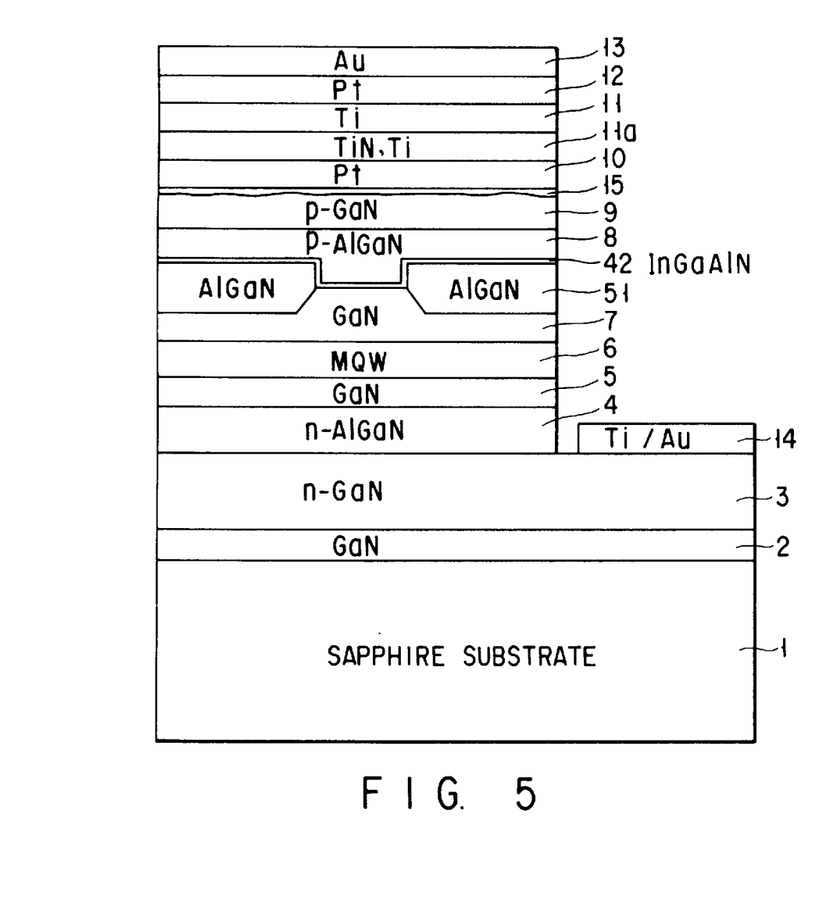
FIG. 5 is a cross-sectional view showing the schematic structure of a blue semiconductor laser according to a fifth embodiment of the present invention.

Next, the blue semiconductor laser of the fifth embodiment will be explained. FIG. 5 is a cross sectional view showing the schematic structure of the blue semiconductor laser. In FIG. 5, the same reference numerals as FIG. 1 are added to the portions common to FIG. 1, and the specific explanation will be omitted. Then, only the portions different from FIG. 1 will be described.

Unlike the first embodiment, the semiconductor laser of this embodiment has an inner stripe structure. Specifically, as shown in FIG. 5, a junction between the GaN waveguide layer 7 and the p-type $Al_{0.8}Ga_{0.2}N$ clad layer 8 is formed through the InGaAlN smoothing layer 42. Then, the inner stripe structure is formed of an undope $Al_{0.1}Ga_{0.9}N$ block layer 51.

The GaN waveguide layer 7, which is formed on the active layer 6, is an undope semiconductor layer having a mesa shape having a width of 10 μm, and a thickness of 0.2 μm. A mesa lower portion of the GaN waveguide layer 7 has a thickness of 0.1 μm, and the undope $Al_{0.1}Ga_{0.9}N$ block layer 51 is formed thereon.

The p-type $Al_{0.8}Ga_{0.2}N$ clad layer 8 has a window having a width of 10 μm. The p-type $Al_{0.8}Ga_{0.2}N$ clad layer 8 is formed on the mesa upper portion of the GaN waveguide layer 7 and the undope $Al_{0.1}Ga_{0.9}N$ block layer 51 through the InGaAlN smoothing layer 42 such that the window is opposite to the mesa upper portion of the GaN waveguide layer 7. The p-type $Al_{0.8}Ga_{0.2}N$ clad layer 8 is a layer of Mg dope, $5 \times 10^{17}$ $cm^{-3}$, (window) thickness of 0.3 μm).

This blue semiconductor laser is manufactured by the same way as the first embodiment, except that the number of times of growths by MOCVD is three due to the inner stripe structure.

The above-explained blue semiconductor laser was continuously generated at room temperature at the threshold current of 60 mA. In this case, the wavelength was 420 nm, the operation voltage was 5V, and a device life time was 5000 hours under conditions of 50° C. and 30 mW drive. In the case of this laser, the same advantage as the fourth embodiment was obtained.

(Modification)

Figure 6:
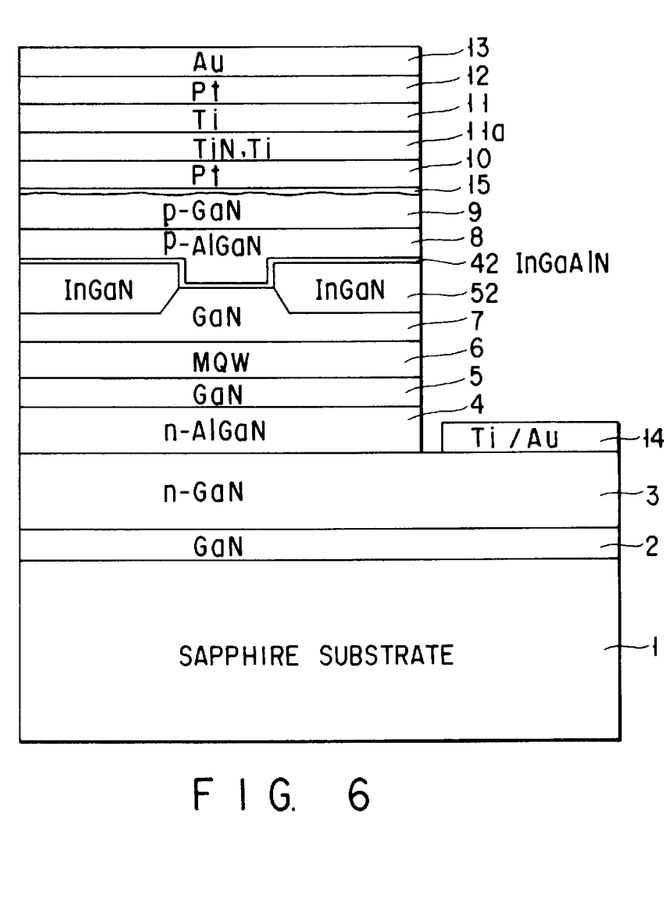
FIG. 6 is a cross-sectional view showing the schematic structure of a modification of the embodiment.

As shown in FIG. 6, the InGaN block layer 52 may be used in place of the AlGaN block layer 51. The modification using the InGaN layer 52 can control a transverse mode well.

(Sixth embodiment)

Figure 7:
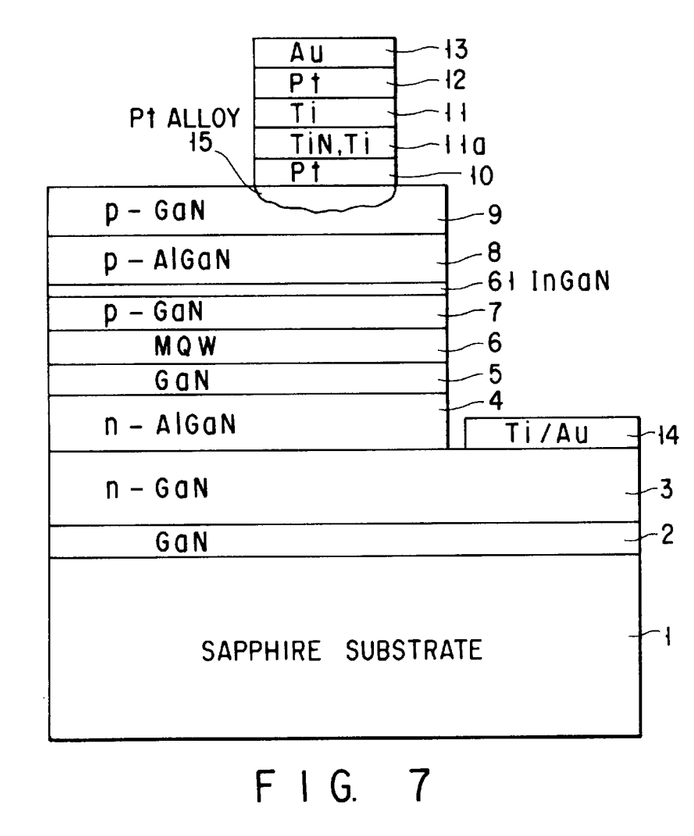
FIG. 7 is a cross-sectional view showing the schematic structure of a blue semiconductor laser according to a sixth embodiment of the present invention.

Next, the blue semiconductor laser of the sixth embodiment will be explained. FIG. 7 is a cross sectional view showing the schematic structure of the blue semiconductor laser. In FIG. 7, the same reference numerals as FIG. 1 are added to the portions common to FIG. 1, and the specific explanation will be omitted. Then, only the portions different from FIG. 1 will be described.

Unlike the first embodiment in which the active layer (MQW) 6 also serves as a GaInAlN smoothing layer containing In, an InGaN smoothing layer 61 of GaInAlN series material containing In is formed between the p-type AlGaN clad layer 8 and the p-type GaN waveguide layer 7.

The InGaN smoothing layer 61 can be formed in a range in which In composition is over, e.g., 0 and 0.3 or less. If the In composition is higher than the In composition of the quantum well layer of the active layer 6, the thickness of the InGaN smoothing layer 61 is formed to be thinner than the thickness of the quantum well layer. For example, in the first embodiment, the $In_{0.2}Ga_{0.8}N$ well layer having a thickness of 2.5 nm is used. In accordance with this condition, the InGaN smoothing layer 61 of the sixth embodiment uses $In_{0.3}Ga_{0.7}N$ layer having a thickness of 1.5 nm.

Thus, in the case having the high In composition and the thick film thickness, the smoothing layer functions as supersaturated absorption layer. Due to this, the structure of this embodiment can operate as a laser with low noise, which is necessary to, e.g., an optical disk system.

Figure 8:
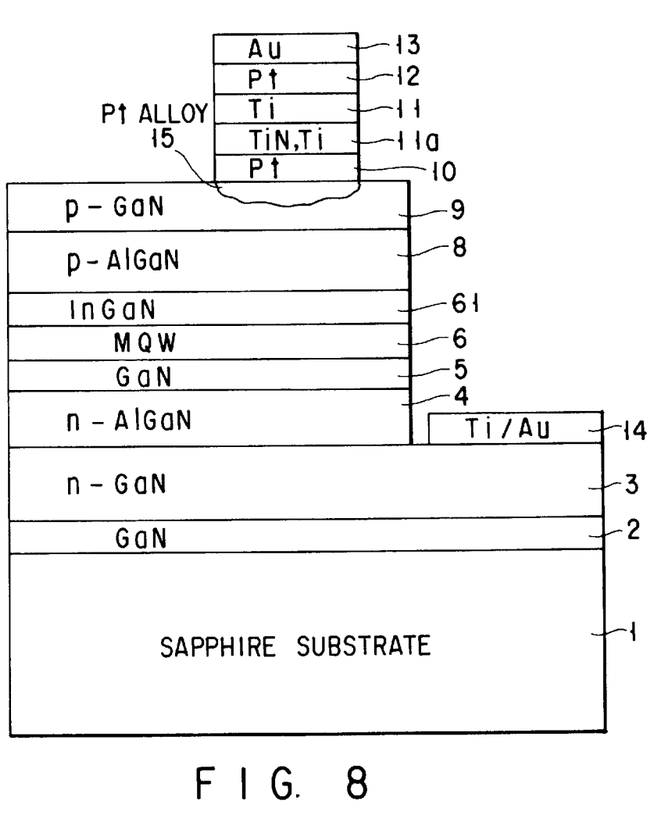
FIG. 8 is a cross-sectional view showing the schematic structure of a modification of the embodiment.

If the In composition is lower than the In composition of the quantum well layer of the active layer 6, the thickness of the InGaN smoothing layer 61 is formed to be thicker than the thickness of the quantum well layer. For example, in the first embodiment, the $In_{0.2}Ga_{0.8}N$ well layer having a thickness of 2.5 nm is used. In accordance with this condition, the smoothing layer 61 of this embodiment uses a layer of $In_{0.1}Ga_{0.9}N$ having a thickness of 0.1 μm. The $In_{0.1}Ga_{0.9}N$ smoothing layer 61 may be replaced with the p-type GaN waveguide layer 7 as shown in FIG. 8.

Thus, in the case having the low In composition and a high film thickness, the effective refractive index of the active layer 6 is increased, so that a light guiding (or confining) characteristic can be improved. In accordance with the increase in the light guiding characteristic, the p-type AlGaN clad layer 8 can function even if the film thickness is reduced.

In the case where the In composition is low, the film thickness is increased, and p-type carrier concentration is set to $1 \times 10^{18}$ cm$^{-3}$ or more. Thereby, the overflow of the electrons can be prevented, and the laser can be generated by the low threshold value.

(Seventh embodiment)

Figure 9:
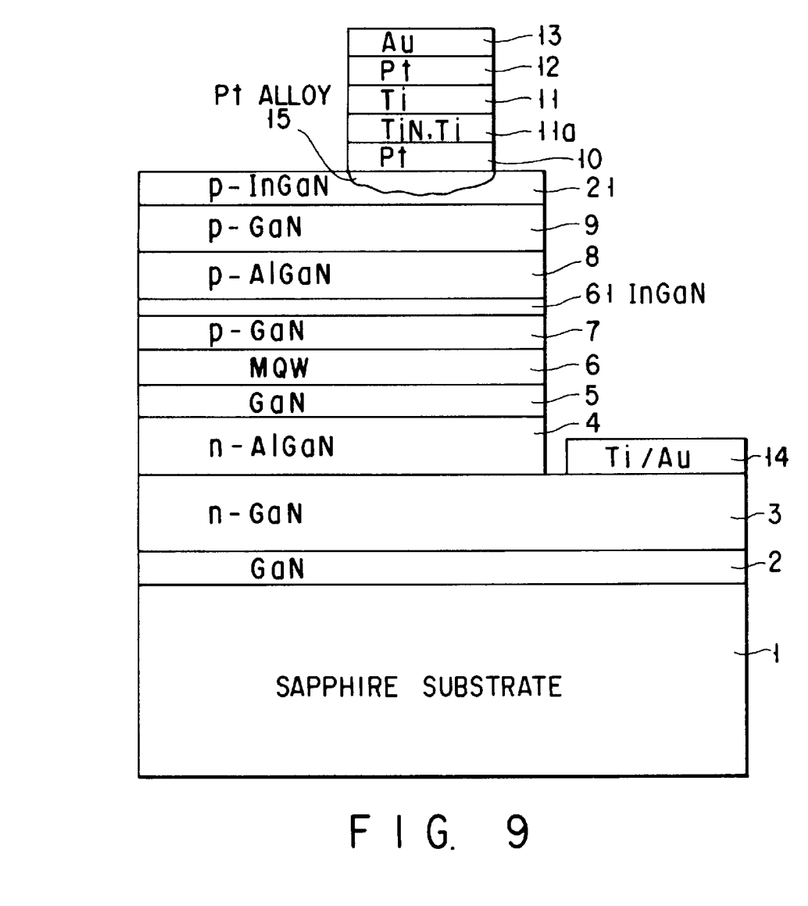
FIG. 9 is a cross-sectional view showing the schematic structure of a blue semiconductor laser according to a seventh embodiment of the present invention.
Figure 10:
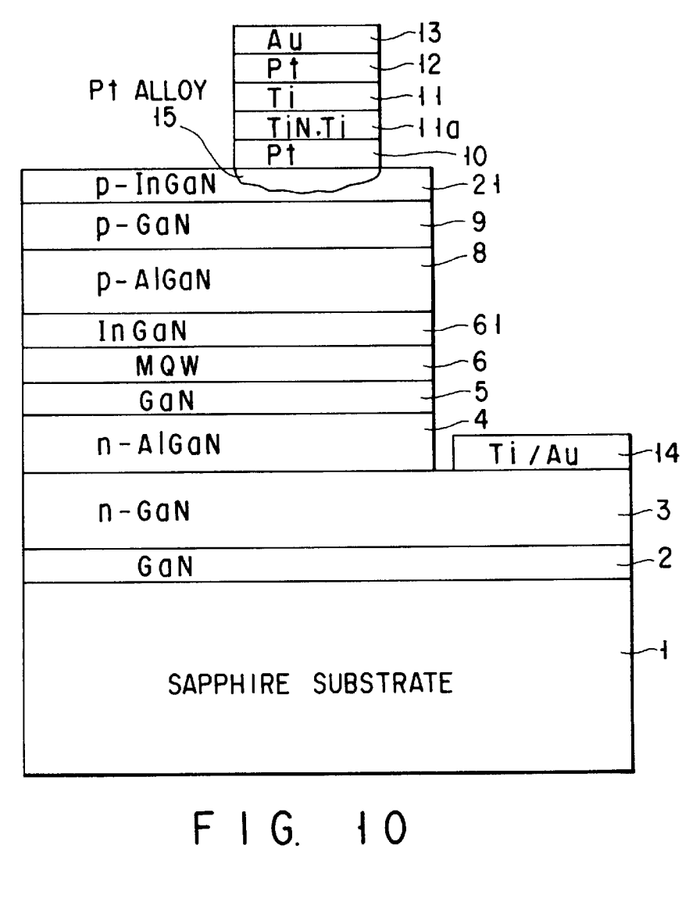
FIG. 10 is a cross-sectional view showing the schematic structure of a modification of the embodiment.

Next, the blue semiconductor laser of the seventh embodiment will be explained. FIG. 9 is a cross sectional view showing the schematic structure of the blue semiconductor laser, and FIG. 10 is a cross-sectional view showing the modification. In these figures, the same reference numerals as FIG. 2 are added to the portions common to FIG. 2, and the specific explanation will be omitted. Then, only the portions different from FIG. 2 will be described.

As compared with the second embodiment having the p-type $In_{0.1}Ga_{0.9}N$ contact layer 21, as shown in FIG. 9, the InGaN smoothing layer 61 of GaInAlN series material containing In is formed between the p-type AlGaN clad layer 8 and the p-type GaN waveguide layer 7, similar to the sixth embodiment. Or, as shown in FIG. 10, the InGaN smoothing layer 61 is formed in place of the p-type GaN waveguide layer 7.

The composition of the InGaN smoothing layer 61 and the film thickness are the same as explained in the sixth embodiment. The same advantage as the second and sixth can be obtained by the above-mentioned structure.

(Eighth embodiment)

Figure 11:
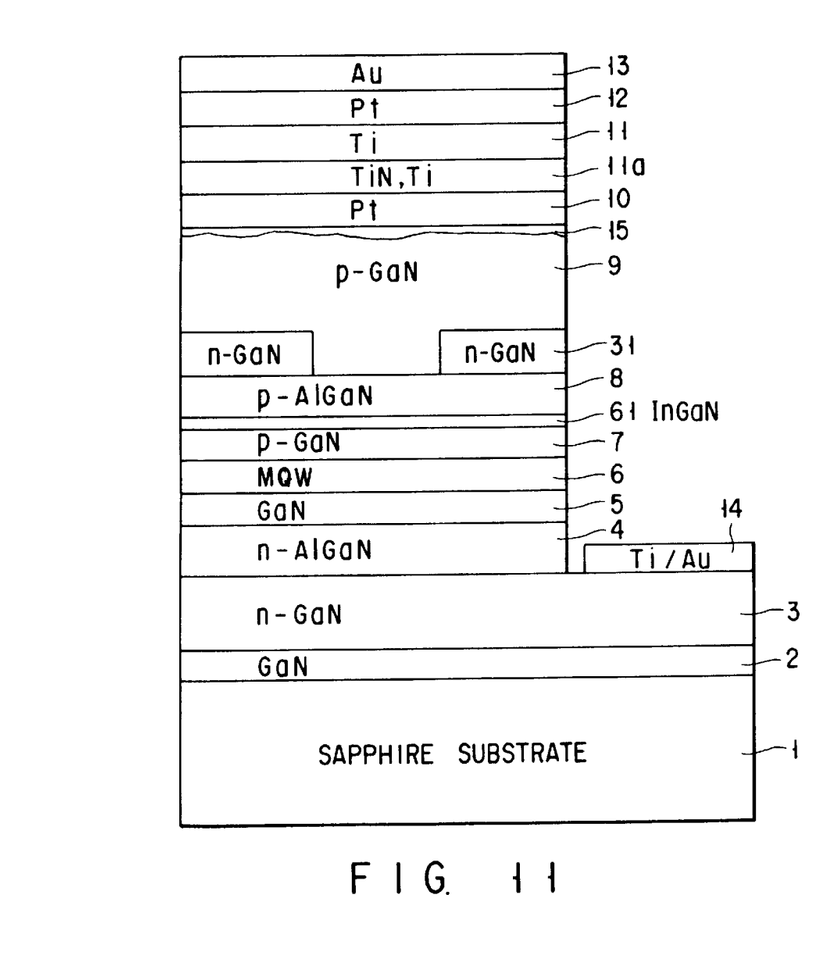
FIG. 11 is a cross-sectional view showing the schematic structure of a blue semiconductor laser according to an eighth embodiment of the present invention.
Figure 12:
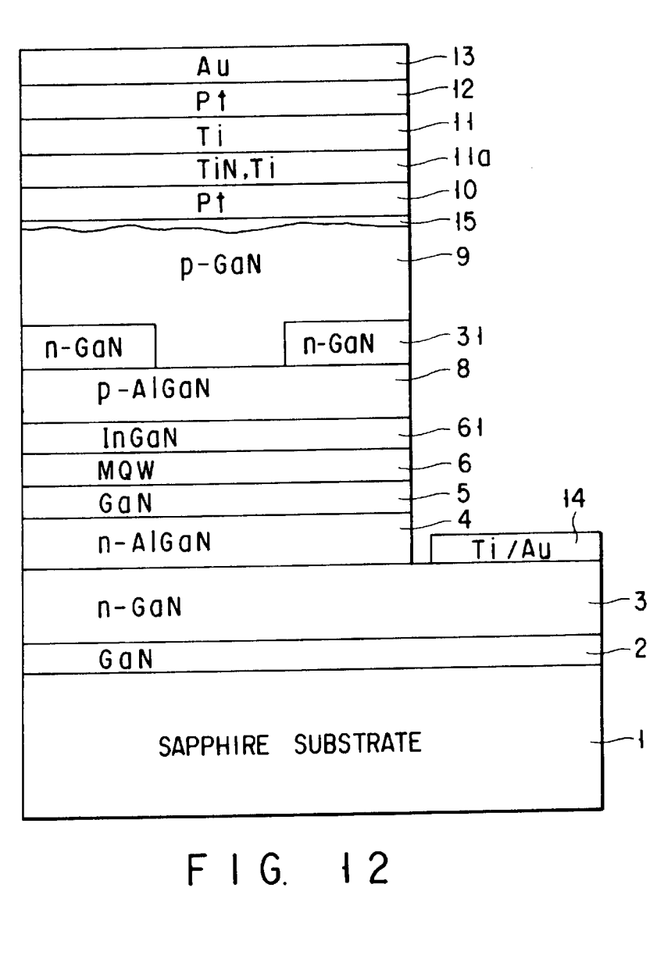
FIG. 12 is a cross-sectional view showing the schematic structure of a modification of the embodiment.

Next, the blue semiconductor laser of the eighth embodiment will be explained. FIG. 11 is a cross sectional view showing the schematic structure of the blue semiconductor laser, and FIG. 12 is a cross-sectional view showing the modification. In these figures, the same reference numerals as FIG. 3 are added to the portions common to FIG. 3, and the specific explanation will be omitted. Then, only the portions different from FIG. 3 will be described.

As compared with the third embodiment having the inner stripe structure, as shown in FIG. 11, $In_{0.1}Ga_{0.9}N$ smoothing layer 32 is omitted. Then, the InGaN smoothing layer 61 of GaInAlN series material containing In is formed between the p-type AlGaN clad layer 8 and the p-type GaN waveguide layer 7, similar to the sixth embodiment. Or, as shown in FIG. 12, the InGaN smoothing layer 61 is formed in place of the p-type GaN waveguide layer 7.

The composition of the InGaN smoothing layer 61 and the film thickness are the same as explained in the sixth embodiment. The same advantage as the third and sixth can be obtained by the above-mentioned structure. Particularly, in the eighth embodiment having the block layer 31, by the increase in the effective refractive index of the active layer 6, an equivalent refractive index of the active layer 6 is increased, the difference between the active layer 6 and the block layer 31 in the refractive index is enlarged. As a result, the fundamental transverse mode is stabilized, and an astigmatic difference is decreased, so that the laser, which is suitable for the optical system, can be realized.

(Ninth embodiment)

Figure 13:
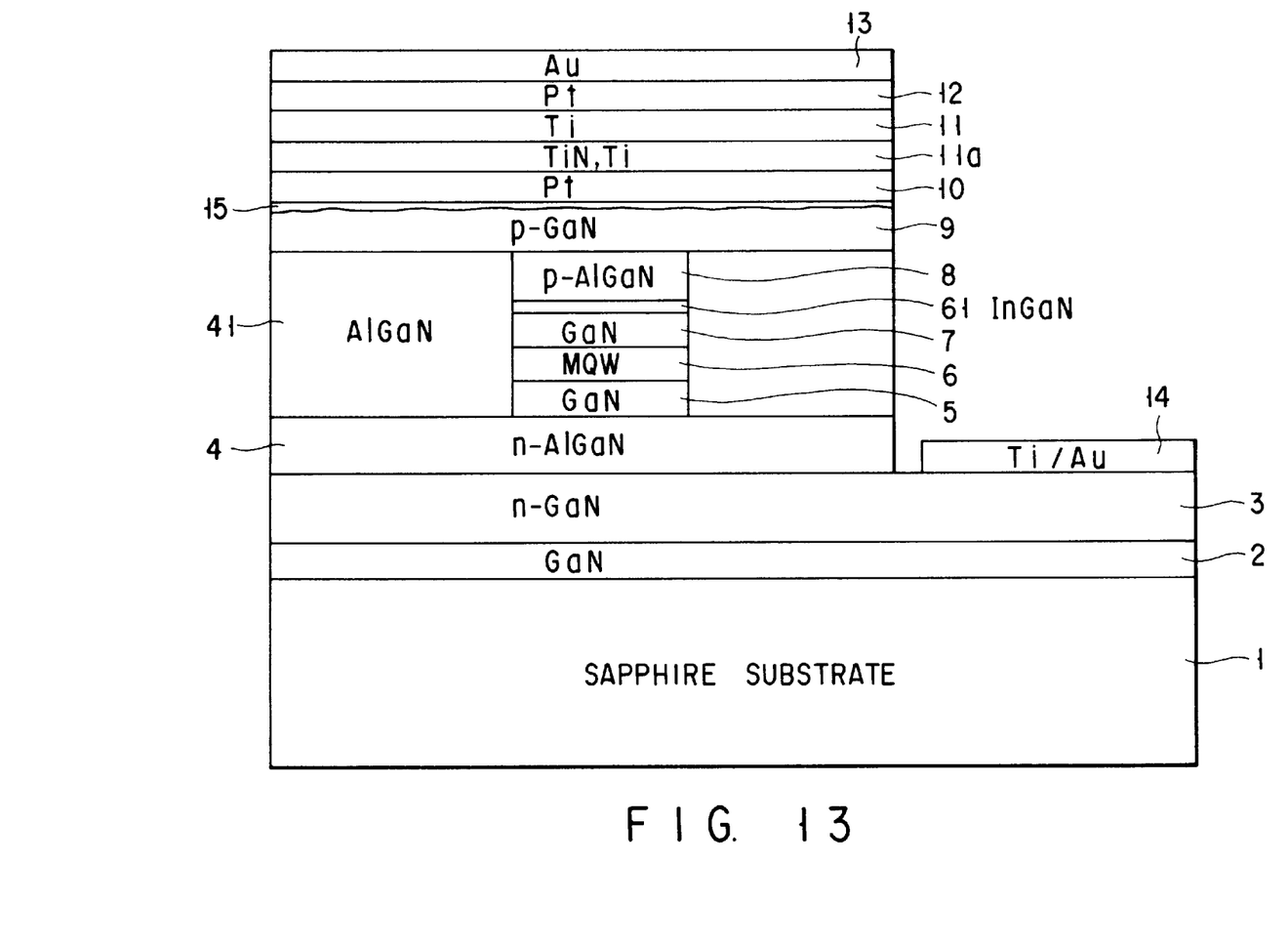
FIG. 13 is a cross-sectional view showing the schematic structure of a blue semiconductor laser according to a ninth embodiment of the present invention.
Figure 14:
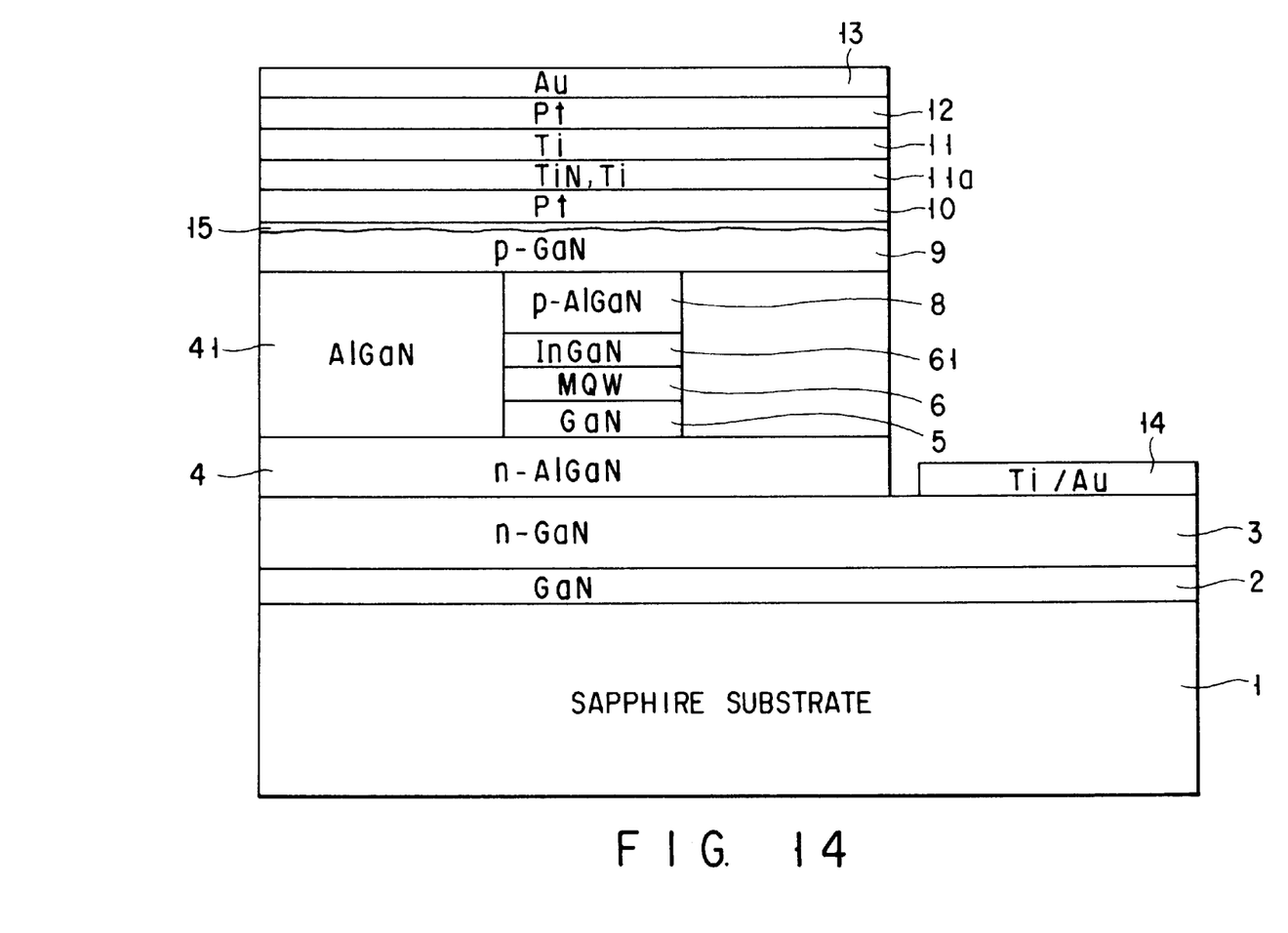
FIG. 14 is a cross-sectional view showing the schematic structure of a modification of the embodiment.

Next, the blue semiconductor laser of the ninth embodiment will be explained. FIG. 13 is a cross sectional view showing the schematic structure of the blue semiconductor laser, and FIG. 14 is a cross-sectional view showing the modification. In these figures, the same reference numerals as FIG. 4 are added to the portions common to FIG. 4, and the specific explanation will be omitted. Then, only the portions different from FIG. 4 will be described.

As compared with the fourth embodiment having the buried inner stripe structure, as shown in FIG. 13, $In_{0.1}Ga_{0.9}N$ smoothing layer 42 is omitted. Then, the InGaN smoothing layer 61 of GaInAlN series material containing In is formed between the p-type AlGaN clad layer 8 and the p-type GaN waveguide layer 7, similar to the sixth embodiment. Or, as shown in FIG. 14, the InGaN smoothing layer 61 is formed in place of the p-type GaN waveguide layer 7.

The composition of the InGaN smoothing layer 61 and the film thickness are the same as explained in the sixth embodiment. The same advantage as the fourth and sixth can be obtained by the above-mentioned structure.

(Tenth embodiment)

Figure 15:
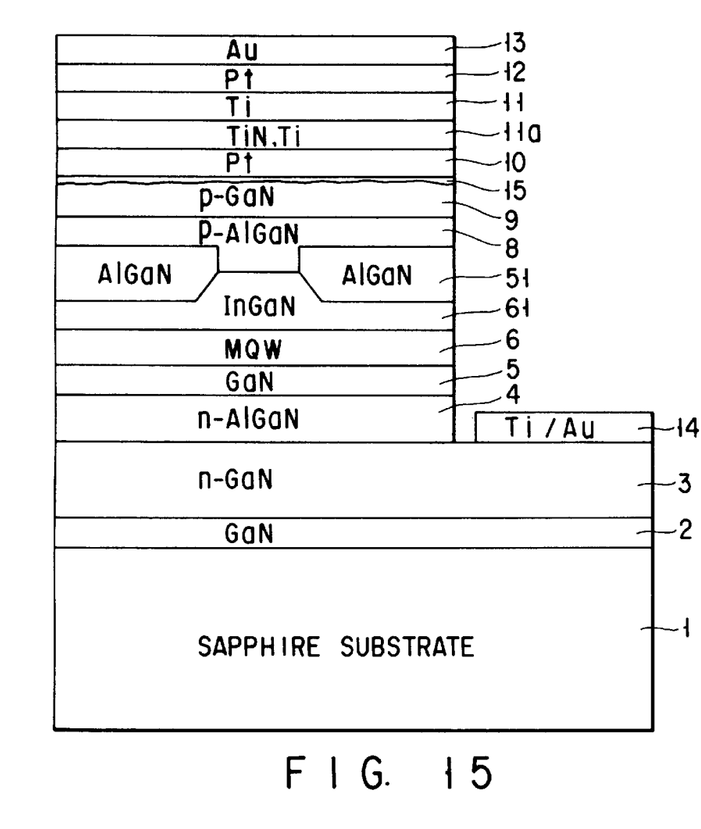
FIG. 15 is a cross-sectional view showing the schematic structure of a blue semiconductor laser according to a tenth embodiment of the present invention.
Figure 16:
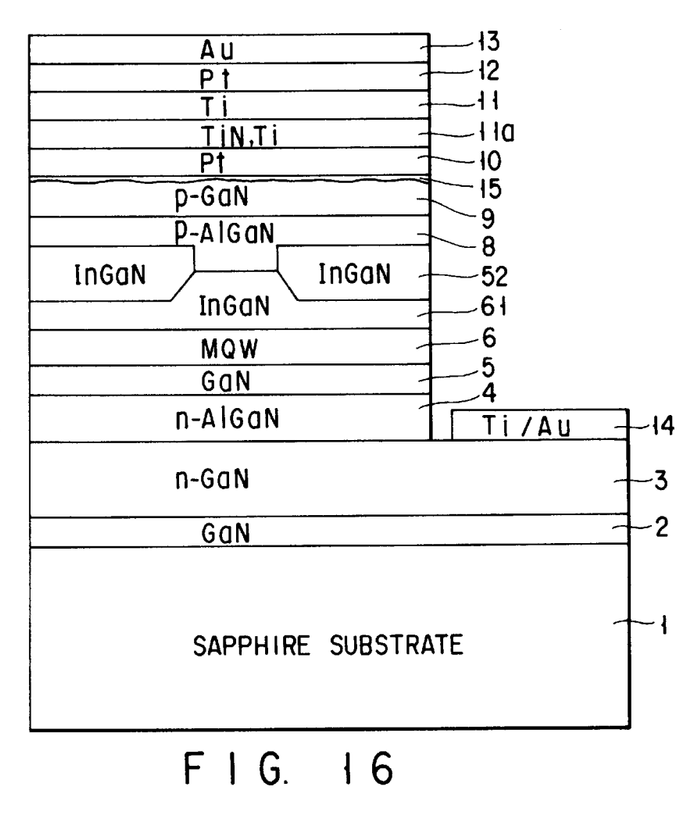
FIG. 16 is a cross-sectional view showing the schematic structure of a modification of the embodiment.

Next, the blue semiconductor laser of the tenth embodiment will be explained. FIG. 15 is a cross sectional view showing the schematic structure of the blue semiconductor laser, and FIG. 16 is a cross-sectional view showing the modification. In these figures, the same reference numerals as FIG. 5 are added to the portions common to FIG. 5, and the specific explanation will be omitted. Then, only the portions different from FIG. 5 will be described.

As compared with the fifth embodiment having the inner stripe structure, as shown in FIG. 15, $In_{0.1}Ga_{0.9}N$ smoothing layer 42 is omitted. Then, the InGaN smoothing layer 61 of GaInAlN series material containing In is formed in place of the p-type GaN waveguide layer 7, similar to the sixth embodiment.

The composition of the InGaN smoothing layer 61 and the film thickness are the same as explained in the sixth embodiment. The same advantage as the fifth and sixth can be obtained by the above-mentioned structure. Particularly, in the tenth embodiment having the block layer 51, similar to the third embodiment, the fundamental transverse mode is stabilized, and an astigmatic difference is decreased, so that the laser, which is suitable for the optical system, can be realized. As shown in FIG. 16, according to this embodiment, it is needless to say that the InGaN block layer 52 can be used in place of the AlGaN block layer 51.

(Other embodiments)

(P-side electrode structure)

In the above first to tenth embodiments, Pt/Ti/Pt/Au were vaporized to form the layered structure of Pt/Ti(N)/Ti/Pt/Au in forming the p-side electrode. The present invention is not limited these embodiments. In place of Pt between Ti and Au, a plurality of conductive layers or a single Ni or Mo may be formed. The reason is that Ni and Mo have dry etching resistance as high as Pt and they are suitable for a dry etching process. There is a case in which the structure having the plurality of conductive layers is needed in the electrode wiring. The material of each conductive layer is prevented from being diffused downward by Ti. Au or Al is preferably used as a top portion of the p-side electrode. Au is suitable for a wire assembly using an Au wire, and this can prevent the surface of the p-side electrode from being oxidized. Al can be also used in the wire assembly. Also, a metal layer in contact with p-type GaN contact layer, is not limited to Pt, but may be another metal layer e.g. Pd or Ni. In this case, a thickness of the metal layer is preferably thinned to 50 nm or less.

(N-side electrode structure)

In the first to tenth embodiments, the n-side electrode was formed of Ti/Au. However, the present invention is not limited to the above-mentioned embodiments. The n-side electrode may be formed of Al/Ti/Au. If there is no process having a heat history of 400° C. or more after forming the n electrode, the structure of Al/Ti/Au has lower contact resistance.

(Relevant invention)

The following will explain the relevant invention to the above-explained present invention. To supply a current to a p-type semiconductor of GaN series, there is formed a p-type semiconductor layer containing 1% or more of each of palladium (Pd) or Pt and Ti. Thereby, the reduction of the operation voltage and the control of the heating value are improved. Moreover, the diffusion due to the electrical conduction of the constituent elements is prevented, so that reliability is improved.

For example, to supply the current to the p-type semiconductor layer of the compound semiconductor device of III–V group having a hexagonal crystal structure, there is formed a p-type semiconductor layer containing 1% or more of each of Pd or Pt and Ti. Thereby, substantial electrode contact area is increased, and electrode resistance can be reduced to about $10^{-5}$ $\Omega cm^2$. Moreover, the layer formed in the area, which is shallow from the surface of the semiconductor of GaN series, contains the combination of Ti and N. As a result, a stable diffusion prevention layer is formed, and the element diffusion occurred at the time of turning on electricity can be restrained, and the deterioration of the device can be prevented.

Also, the p-type semiconductor layer is structured to be a semiconductor of $Ga_xIn_yAl_zN$ ($0 \leq x, y, z \leq 1$, and $z+y+z=1$). Thereby, electrode resistance to the p-type semiconductor layer, which contains 1% or more of each of Pd or Pt and Ti, can be reduced to $10^{-6}$ $\Omega cm^2$. Moreover, in the semiconductor device having Pd or Pt (ranging 10 nm or less) formed on the surface of the p-type semiconductor layer of the compound semiconductor device of III–V group having a hexagonal crystal structure, Ti (ranging 50 nm or less) formed thereon, and an electrode metal for supplying a current to the p-type semiconductor layer formed thereon, there can be formed a p-type semiconductor layer having a thickness of 20 nm or less and containing 1% or more of each of Pd or Pt, which has chemically strong combination in the heating treatment of 300° C. or more, and Ti.

(Others)

The present invention and the relevant invention are not limited to the first to tenth embodiments. The composition and the thickness of the semiconductor layer may be variously changed, and the conductivity may be oppositely structured. Also, the present invention may be applied to the electronic devices such as a light receiving device, and a transistor other than the light-emitting device.

Additional advantages and modifications will be readily occur to those skilled in the art. Therefore, the invention in its broader aspect is not limited to the specific details and respective devices shown and described herein. Accordingly, various modifications may be made without departing from the spirit or scope of the general inventive concept as defined by the appended claims and their equivalents.

We claim:

1. A compound semiconductor light-emitting device having a compound semiconductor ($Ga_{x1}In_{y1}Al_{z1}N$: $x1+y1+z1=1$, $0 \leq x1$, $y1$, $z1 \leq 1$) comprising:

an n-type semiconductor layer having at least an n-type clad layer;

an active layer formed on said n-type semiconductor layer;

a p-type semiconductor layer, formed on said active layer, having at least a p-type clad layer;

a smoothing layer of $Ga_{x2}In_{y2}Al_{z2}N$ ($x2+y2+z2=1$, $0 \leq x2$, $z2 \leq 1$, $0<y2 \leq 1$) formed in said active layer;

a p-type contact layer, formed on said p-type semiconductor layer, having a p-type impurity added thereto;

a p-side electrode formed on said p-type contact layer; and an n-side electrode electrically connected with said n-type semiconductor layer.

2. The compound semiconductor light-emitting device according to claim 1, wherein said p-type contact layer contains Mg as said p-type impurity.

3. A compound semiconductor light-emitting device having a compound semiconductor ($Ga_{x1}In_{y1}Al_{z1}N$: $x1+y1+z1=1$, $0 \leq x1$, $y1$, $z1 \leq 1$) comprising:

an n-type semiconductor layer having at least an n-type clad layer;

an active layer formed on said n-type semiconductor layer;

a p-type semiconductor layer, formed on said active layer, having at least a p-type clad layer;

a smoothing layer of $Ga_{x2}In_{y2}Al_{z2}N$ ($x2+y2+z2=1$, $0 \leq x2$, $z2 \leq 1$, $0<y2 \leq 1$) formed in said active layer;

a p-type contact layer, formed on said p-type semiconductor layer, having a p-type impurity added thereto;

an alloy layer, made of Pt-semiconductor, selectively formed on a surface of said p-type contact layer;

a p-side electrode, containing a layered structure made of a Pt layer formed on said alloy layer, a Ti layer containing TiN, thereon, and a Ti layer thereon; and an n-side electrode electrically connected with said n-type semiconductor layer.

4. The compound semiconductor light-emitting device according to claim 3, wherein an Au layer is formed on said Ti layer through a second Pt layer.

5. The compound semiconductor light-emitting device according to claim 3, wherein said p-type contact layer contains carbon, and carbon concentration of a boundary between said Ti layer containing TiN, and said Pt layer is higher than carbon concentration of said p-type contact layer.

6. The compound semiconductor light-emitting device according to claim 3, wherein said p-type contact layer contains carbon and oxygen, and carbon concentration of a boundary between said Ti layer containing TiN and said Pt layer is higher than carbon concentration of said p-type contact layer, and oxygen concentration of said boundary is higher than oxygen concentration of said p-type contact layer.

7. The compound semiconductor light-emitting device according to claim 3, wherein said p-type contact layer contains hydrogen, and hydrogen concentration of a boundary between said second Pt layer and said Au layer is higher than hydrogen concentration of said p-type contact layer.

8. The compound semiconductor light-emitting device according to claim 3, wherein said n-side electrode has a layered structure having the Ti layer and Au layer formed in order.

9. A compound semiconductor light-emitting device having a compound semiconductor ($Ga_{x1}In_{y1}Al_{z1}N$: $x1+y1+z1=1$, $0\leq x1$, $y1$, $z1<1$) comprising:

an n-type-semiconductor layer having at least an n-type clad layer:

an active layer, formed on said n-type semiconductor layer, having a multi-quantum well structure having well layers, formed of at least $Ga_{x3}In_{y3}Al_{z3}N$ ($x3+y3+z3=1$, $0\leq x3$, $y3$, $z3\leq 1$) and barrier layers, formed of $Ga_{x4}In_{y4}Al_{z4}N$ ($x4+y4+z4=1$, $0\leq x4$, $y4$, $z4\leq 1$), alternatively layered;

a p-type semiconductor layer, formed on said active layer, having at least a p-type clad layer;

a smoothing layer of $Ga_{x2}In_{y2}Al_{z2}N$ ($x2+y2+z2=1$, $0\leq x2$, $z2<1$, $0<y2\leq 1$) formed in said p-type semiconductor layer;

a p-type contact layer, formed on said p-type semiconductor layer, having a p-type impurity added thereto;

a p-side electrode formed on said p-type contact layer; and an n-side electrode electrically connected with said n-type semiconductor layer, wherein said $Ga_{x2}In_{y2}Al_{z2}N$ smoothing layer is formed to be thicker than the thickness of said well layer when In composition y2 is lower than In composition y3 of said well layer.

10. The compound semiconductor light-emitting device according to claim 9, wherein said p-type contact layer has an alloy layer, made of Pt-semiconductor, selectively formed on its surface, and said p-side electrode has a layered structure made of a Pt layer formed on said alloy layer, a Ti layer containing TiN, thereon, and a Ti layer thereon.

11. The compound semiconductor light-emitting device according to claim 9, wherein said $Ga_{x2}In_{y2}Al_{z2}N$ smoothing layer is formed to be thicker than the thickness of said well layer and a p-type carrier concentration is $1\times 10^{18}$ cm$^{-3}$ or more when In composition y2 is lower than In composition y3 of said well layer.

12. A compound semiconductor light-emitting device having a compound semiconductor ($Ga_{x1}In_{y1}Al_{z1}N$: $x1+y1+z1=1$, $0\leq x1$, $y1$, $z1\leq 1$) comprising:

an n-type semiconductor layer having at least an n-type clad layer;

an active layer, formed on said n-type semiconductor layer, having a multi-quantum well structure having well layers, formed of at least $Ga_{x3}In_{y3}Al_{z3}N$ ($x3+y3+z3=1$, $0\leq x3$, $y3$, $z3\leq 1$), and barrier layers, formed of $Ga_{x4}In_{y4}Al_{z4}N$ ($x4+y4+z4=1$, $0\leq x4$, $y4$, $z4\leq 1$) alternatively layered:

a p-type semiconductor layer, formed on said active layer, having at least a p-type clad layer;

a smoothing layer of $Ga_{x2}In_{y2}Al_{z2}N$ ($x2+y2+z2=1$, $0\leq x2$, $z2\leq 1$, $0<y2\leq 1$) formed in said p-type semiconductor layer;

a p-type contact layer, formed on said p-type semiconductor layer, having a p-type impurity added thereto;

a p-side electrode formed on said p-type contact layer; and an n-side electrode electrically connected with said n-type semiconductor layer, wherein said n-type semiconductor layer, wherein said $Ga_{x2}In_{y2}Al_{z2}N$ smoothing layer is formed to be thinner than the thickness of said well layer when In composition y2 is higher than In composition y3 of said well layer.

13. The compound semiconductor light-emitting device according to claim 12, wherein said p-type contact layer has an alloy layer, made of Pt-semiconductor, selectively formed on its surface, and said p-side electrode has a layered structure made of a Pt layer formed on said alloy layer, a Ti layer containing TiN, thereon, and a Ti layer thereon.

14. A compound semiconductor light-emitting device having a compound semiconductor ($Ga_{x1}In_{y1}Al_{z1}N$: $x1+y1+z1=1$, $0\leq x1$, $y1$, $z1\leq 1$) (comprising:

an n-type clad layer;

an n-type waveguide layer formed on said n-type clad layer;

an active layer formed on said waveguide layer;

a p-type waveguide layer, formed on said active layer, having a stripe ridge;

a block layer selectively formed on along a side portion of the ridge of said p-type waveguide layer;

a smoothing layer of $Ga_{x2}In_{y2}Al_{z2}N$ ($x2+y2+z2=1$, $x2$, $z2\leq 1$, $0<y2\leq 1$) formed on said block layer and the ridge of said p-type waveguide layer;

a p-type clad layer formed on said $Ga_{x2}In_{y2}Al_{z2}N$ smoothing layer;

a p-type contact layer, formed on said p-type clad layer, having a p-type impurity added thereto;

a p-side electrode formed on said p-type contact layer; and an n-side electrode electrically connected with said n-type semiconductor layer, wherein said block layer is formed of $Ga_{x5}In_{y5}Al_{z5}N$ ($x5+y5+z5=1$, $0\leq x5$, $y5\leq 1$, $0\leq z5\leq 1$).

15. The compound semiconductor light-emitting device according to claim 14, wherein said active layer is a multi-quantum well structure having well layers ($x3+y3+z3=1$, $0\leq x3$, $y3$, $z3\leq 1$), formed of at least $Ga_{x3}In_{y3}Al_{z3}N$, and barrier layers, formed $Ga_{x4}In_{y4}Al_{z4}N$ ($x4+y4+z4=1$, $0\leq x4$, $y4$, $z4\leq 1$), alternatively layered.

16. The compound semiconductor light-emitting device according to claim 14, wherein said p-type contact layer has an alloy layer, made of Pt-semiconductor, selectively formed on its surface, and said p-side electrode has a layered structure made of a Pt layer formed on said alloy layer, a Ti layer containing TiN, thereon, and a Ti layer thereon.

17. A compound semiconductor light-emitting device having a compound semiconductor ($Ga_{x1}In_{y1}Al_{z1}N$: $x1+y1+z1=1$, $0\leq x1$, $y1$, $z1\leq 1$) comprising:

an n-type clad layer;

an n-type waveguide layer formed on said n-type clad layer;

an active layer formed on said n-type waveguide layer;

a p-type waveguide layer, formed on said active layer, having a stripe ridge;

a block layer selectively formed on along a side portion of the ridge of said p-type waveguide layer;

a smoothing layer of $Ga_{x2}In_{y2}Al_{z2}N$ ($x2+y2+z2=1$, $x2$, $z2\leq 1$, $0<y2\leq 1$) formed on said block layer and the ridge of said p-type conductive layer;

a p-type clad layer formed on said $Ga_{x2}In_{y2}Al_{z2}N$ smoothing layer;

a p-type contact layer, formed on said p-type clad layer, having a p-type impurity added thereto;

a p-side electrode formed on said p-type contact layer; and an n-side electrode electrically connected with said n-type semiconductor layer, wherein said block layer is formed of $Ga_{x5}In_{y5}Al_{z5}N$ (x5+y5+z5=1,0≦x5, z5≦1, 0<y5≦1).

18. The compound semiconductor light-emitting device according to claim 17, wherein said active layer is a multi-quantum well structure having well layers (x3+y3+z3=1, 0≦x3, y3, z3≦1), formed of at least $Ga_{x3}In_{y3}Al_{z3}N$, and barrier layers, formed $Ga_{x4}In_{y4}Al_{z4}N$ (x4+y4+z4=1, 0≦x4, y4, z4≦1), alternatively layered.

19. The compound semiconductor light-emitting device according to claim 17, wherein said p-type contact layer has an alloy layer, made of Pt-semiconductor, selectively formed on its surface, and said p-side electrode has a layered structure made of a Pt layer formed on said alloy layer, a Ti layer containing TiN, thereon, and a Ti layer thereon.

20. A compound semiconductor light-emitting device having a compound semiconductor ($Ga_{x1}In_{y1}Al_{z1}N$: x1+y1+z1=1, 0≦x1, y1, z1≦1) comprising an n-type semiconductor layer having at least an n-type clad layer;

an active layer formed on said n-type semiconductor layer;

a p-type semiconductor layer, formed on said active layer, having at least a p-type clad layer;

a smoothing layer of $Ga_{x2}In_{y2}Al_{z2}N$ (x2+y2+z2=1, 0≦x2, z2≦1, 0<y2≦1) formed in said p-type semiconductive layer;

a p-type contact layer, formed on said p-type semiconductor layer, having a p-type impurity added thereto;

a p-side electrode formed on said p-type contact layer; and an n-side electrode electrically connected with said n-type semiconductor layer.

21. The compound semiconductor light-emitting device according to claim 20, wherein said active layer is a multi-quantum well structure having well layers (x3+y3+z3=1, 0≦x3, z3≦1, 0<y3≦1), formed of at least $Ga_{x3}In_{y3}Al_{z3}N$, and barrier layers, formed $Ga_{x4}In_{y4}Al_{z4}N$ (x4+y4+z4=1, 0≦x4, z4≦1,0<y4≦1), alternatively layered.

22. The compound semiconductor light-emitting device according to claim 20, wherein said active layer is a multi-quantum well structure having well layers (x3+y3+z3=1, 0<x3, y3, z3≦1), formed of at least $Ga_{x3}In_{y3}Al_{z3}N$, and barrier layers, formed of $G_{x4}In_{y4}Al_{z4}N$ (x4+y4+z4=1, 0≦x4, y4, z4≦1) alternatively layered.

23. A compound semiconductor light-emitting device having a compound semiconductor ($Ga_{x1}In_{y1}Al_{z1}N$: x1+y1+z1=1, 0≦x1, y1, z1≦1) comprising:

an n-type semiconductor layer having at least an n-type clad layer;

an active layer formed on said n-type semiconductor layer;

a p-type semiconductor layer, formed on said active layer, having at least a p-type clad layer;

a smoothing layer of $Ga_{x2}In_{y2}Al_{z2}N$ (x2+y2+z2=1, 0≦x2, z2≦1, 0<y2≦1) formed in said p-type semiconductor layer;

a p-type contact layer, formed on said p-type semiconductor layer, having a p-type impurity added thereto, an alloy layer, made of Pt-semiconductor, selectively formed on a surface of said p-type contact layer;

a p-side electrode, containing a layered structure made of a Pt layer formed on said alloy layer, a Ti layer containing TiN, thereon, and a Ti layer thereon; and an n-side electrode electrically connected with said n-type semiconductor layer.

24. The compound semiconductor light-emitting device according to claim 23, wherein an Au layer is formed on said Ti layer through a second Pt layer.

25. The compound semiconductor light-emitting device according to claim 23, wherein said p-type contact layer contains carbon, and a carbon concentration of a boundary between said Ti layer containing TiN and said Pt layer is higher than a carbon concentration of said p-type contact layer.

26. The compound semiconductor light-emitting device according to claim 23, wherein said p-type contact layer contains carbon and oxygen, and a carbon concentration of a boundary between said Ti layer containing TiN and said Pt layer is higher than a carbon concentration of said p-type contact layer, and an oxygen concentration of said boundary is higher than an oxygen concentration of said p-type contact layer.

27. The compound semiconductor light-emitting device according to claim 23, wherein said p-type contact layer contains hydrogen, and a hydrogen concentration of a boundary between said second Pt layer and said Au layer is higher than a hydrogen concentration of said p-type contact layer.

28. The compound semiconductor light-emitting device according to claim 23, wherein said n-side electrode has as layered structure having the Ti layer and Au layer formed in order.

* * * * *